United States Patent [19]

Tanaka et al.

[11] Patent Number: 4,784,937
[45] Date of Patent: Nov. 15, 1988

[54] DEVELOPING SOLUTION FOR POSITIVE-WORKING PHOTORESIST COMPRISING A METAL ION FREE ORGANIC BASE AND AN ANIONIC SURFACTANT

[75] Inventors: Hatsuyuki Tanaka, Samukawa; Hidekatsu Kohara, Chigasaki; Yoshiyuki Sato, Samukawa; Shingo Asaumi, Fujisawa; Toshimasa Nakayama, Hiratsuka; Akira Yokota, Yamato; Hisashi Nakane, Yokohama, all of Japan

[73] Assignee: Tokyo Ohka Kogyo Co., Ltd., Kanagawa, Japan

[21] Appl. No.: 892,646

[22] Filed: Aug. 4, 1986

[30] Foreign Application Priority Data

Aug. 6, 1985 [JP] Japan .................. 60-171833
Aug. 6, 1985 [JP] Japan .................. 60-171834

[51] Int. Cl.⁴ .............................................. G03C 3/18
[52] U.S. Cl. .................................. 430/331; 430/309
[58] Field of Search ................................ 430/331, 309

[56] References Cited

U.S. PATENT DOCUMENTS 4,147,545 4/1979 Rowe et al. ................... 430/331
4,530,895 7/1985 Simon et al. .................. 430/331
4,603,058 7/1986 Adams ........................... 430/331
4,610,953 9/1986 Hashimoto et al. ............ 430/331
4,613,561 9/1986 Lewis ............................. 430/331

FOREIGN PATENT DOCUMENTS 0179742 9/1985 Japan ............................. 430/331
0223120 11/1985 Japan ............................. 430/331
1367830 9/1974 United Kingdom .......... 430/331

Primary Examiner—Paul R. Michl
Assistant Examiner—Patrick A. Doody
Attorney, Agent, or Firm—Armstrong, Nikaido, Marmelstein & Kubovcik

[57] ABSTRACT

The aqueous developing solution of the invention for positive-working photoresist compositions contains, in addition to an organic basic compound free from metal ions, such as tetramethyl ammonium hydroxide and choline, as the principal ingredient, from 50 to 5000 ppm of an anionic or non-ionic fluorine-containing surface active agent of specific types. In comparison with conventional developing solutions without such a surface active agent, the inventive developing solution is advantageous in the uniformity of the patterned photoresist layer and higher sensitivity and smaller temperature dependency of development.

2 Claims, 2 Drawing Sheets

DEVELOPING SOLUTION FOR POSITIVE-WORKING PHOTORESIST COMPRISING A METAL ION FREE ORGANIC BASE AND AN ANIONIC SURFACTANT

BACKGROUND OF THE INVENTION

The present invention relates to an improved developing solution for positive-working photoresist compositions or, more particularly, to an improved developing solution suitable for use in patterning of a layer of a quinone diazide-based positive-working photoresist composition. The developing solution is imparted with enhanced wettability of the surface of the photoresist layer and dissolving selectivity between the exposed areas and unexposed areas improved so much that no defects are caused in the developed pattern of the photoresist layer. Further, development with the developing solution can be performed with little temperature dependency of the dissolving power in the exposed areas of the photoresist layer.

In the conventional procedures for the manufacture of semiconductor IC devices, photomasks for the manufacture of ICs, printed circuit boards and the like, the substrate plate is subjected to a selective treatment before etching, diffusion and other treatments. With an object to selectively protect certain areas of the substrate surface which should be left intact by the treatment in this case, it is usually undertaken that a coating film is formed on the substrate surface with a composition sensitive to actinic rays such as ultraviolet light, X-rays, electron beams and the like, which is called a photoresist, followed by pattern-wise exposure of the coating film to the actinic rays and development to form a patterned photoresist layer.

Photoresist compositions are classified into positive-working and negative-working ones depending on the change in the solubility behavior by the exposure to actinic rays. Namely, the positive-working photoresist is imparted with increased solubility in a developing solution in the exposed areas and remains insoluble in the unexposed areas while the negative-working photoresist behaves inversely. Typical positive-working photoresist compositions currently on use include combinations of an alkali-soluble novolac resin as the base ingredient and a naphthoquinone diazide compound as a photosensitizer. While such a naphthoquinone diazide-based positive-working photoresist can be developed with an aqueous alkaline solution as the developing solution, aqueous alkaline solutions containing metal ions are undesirable as a developing solution in the manufacture of semiconductor devices because the metal ions may adversely influence the performance of the semiconductor devices processed by the development therewith. Accordingly, developing solutions containing no metal ions should be used in such a case as exemplified by an aqueous solution of tetramethyl ammonium hydroxide disclosed in IBM Technical Disclosure Bulletin, volume 13, No. 7, page 2009 (1970) and an aqueous solution of choline disclosed in U.S. Pat. No. 4,239,661.

One of the difficult problems in the patterning using a positive-working photoresist is the change in the sensitivity depending on the temperautre of the developing solution or the so-called temperature dependency of the developing solution. Namely, for example, the line width of a patterned photoresist layer is subject to variation depending on the temperature of the developing solution while it is a very difficult matter to exactly control the temperature of the developing solution in the procedures of stationary development and spraying development prevailingly practiced in recent years. Therefore, it is eagerly desired to develop a developing solution having a characteristic of outstandingly small temperature dependency in development.

The apparatuses of development currently used in the manufacture of integrated circuits are mostly and increasingly designed for performing stationary development in order to facilitate automatization of the photoresist processing. The stationary development is a process in which a developing solution is dripped to and spread over the surface of a semiconductor silicon wafer coated with a layer of a photoresist composition and, after standing as such for a while, the developing solution is again dripped so that the whole process of development proceeds with the wafer kept stationary throughout. In such a process of stationary development, the spreading velocity of the developing solution over the whole surface of the wafer is the key factor which is determinant of the uniformity of the line width in the patterned photoresist layer on the wafer surface. This problem of spreadability of the developing solution over the wafer surface is more important as the silicon wafers have a larger and larger diameter so that the wettability of the developing solution is one of the most important characteristics required of the solution.

In order to improve the wettability of a developing solution, a method is disclosed in Japanese Patent Kokai No. 58-57128 according to which the developing solution is admixed with 1 to 50% by weight of an organic solvent or a surface active agent. When a hydrophilic solvent such as alcohols, ethylene glycol monoalkyl ethers and the like is added to a developing solution for positive-working photoresist composition such as an aqueous solution of tetramethyl ammonium hydroxide, no improving effect can be obtained in the wettability of the solution when the amount of the added organic solvent is small while increase of the amount of the organic solvent may cause a problem in the selectivity that the photoresist layer is dissolved away by the developing solution not only in the exposed areas but also in the unexposed areas to give an undesired pattern of the photoresist layer. When a surface active agent is added to the developing solution in place of the organic solvents, the problem of the temperature dependency of the developing solution cannot be solved so that the sensitivity is enhanced as the temperature is increased along with an increase in the film thickness reduction in the unexposed areas of the photoresist layer.

Besides, one of the important characteristics required of a developing solution for positive-working photoresist compositions is the so-called dissolving selectivity that dissolution of the photoresist layer is complete in the exposed areas while the photoresist layer in the unexposed areas should be left intact by the developing solution with an as small as possible change in the film thickness by the development. According to the disclosure in Japanese Patent Kokai Nos. 58-9143 and 58-150949, improvements in this regard can be obtained by the addition of a surface active agent of a quaternary ammonium type or a quaternary ammonium salt, respectively. Further, Japanese Patent Kokai No. 60-12547 teaches that contrast of a positive-working photoresist composition can be increased when it is developed using a developing solution containing an alkali metal-containing basic compound and a fluorine-containing surface active agent in combination. This method, however, is far from industrial practicability in the manufacture of semiconductor-based integrated circuits because alkali metal compounds are detrimental to the performance of semiconductor devices in addition to the problem that patterned photoresist layers with reliability can hardly be obtained due to the increased temperature dependency in the power of the developing solution.

SUMMARY OF THE INVENTION

An object of the present invention is therefore to provide a developing solution suitable for patterning of a naphthoquinone diazide-based photoresist layer free from the above described problems and disadvantages in the conventional developing solutions. Namely, the object of the invention is to provide a developing solution imparted with greatly improved wettability on the surface of a photoresist layer and increased dissolving selectivity between the exposed and unexposed areas of the photoresist layer to cause no defects in the patterning by the development. Further, the object of the invention is to provide a developing solution with little temperature dependency of the dissolving power in the exposed areas so as to be quite satisfactorily used in the manufacture of semiconductor devices.

The present invention has been completed on the base of a discovery arrived at as a result of the extensive investigations that admixture of a conventional developing solution for positive-working photoresist compositions with a fluorine-containing surface active agent of a specific type is very effective to achieve the above mentioned objects.

Thus, the developing solution for positive-working photoresist compositions provided by the present invention comprises:

(a) an aqueous medium;
(b) an organic basic compound free from metallic ions; and
(c) an anionic or non-ionic fluorine-containing surface active agent in an amount in the range from 50 to 5000 ppm by weight based on the amount of the developing solution.

DETAILED DESCRIPTION OF THE PREFERRED EMBODIMENTS

Figure 1:
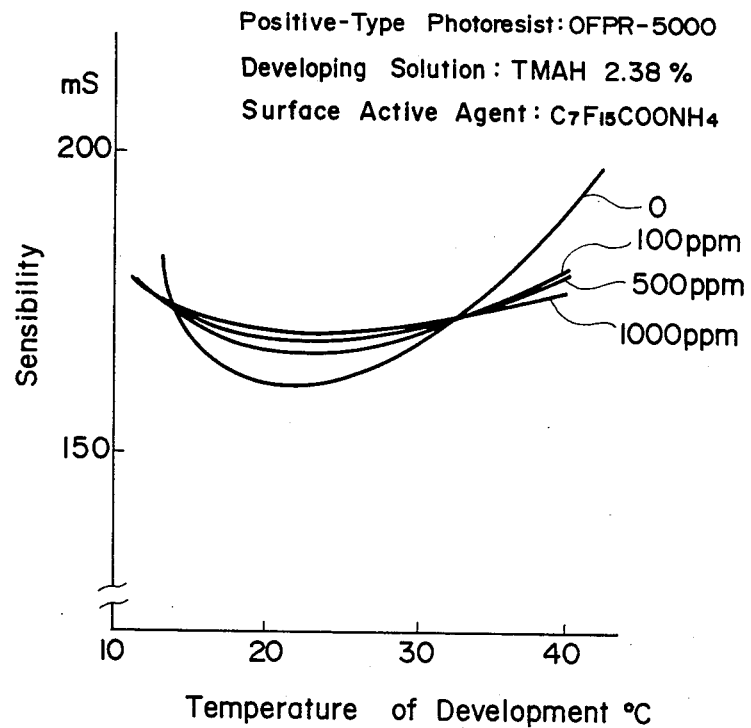
FIG. 1 is a graph showing the sensitivity of developing solutions without or with admixture of varied amounts of a fluorine-containing anionic surface active agent $C_7F_{15}COONH_4$ as a function of the temperature of development.

As is understood from the above given summary, the most characteristic feature of the present invention consists in the admixture of a specific amount of a fluorine-containing surface active agent, which should be anionic or non-ionic, to a developing solution for positive-working photoresist compositions containing a basic organic compound free from metal ions dissolved in an aqueous medium as the solvent. The base developing solution to which the specific surface active agent is added includes not only aqueous solutions of a basic organic compound alone dissolved in water but also those solutions containing various kinds of known additives conventionally added to developing solutions for positive-working photoresist compositions in addition to the basic organic compound as the principal developing reagent.

The basic organic compound free from metal ions as the principal ingredient of the inventive developing solution may be any of known compounds conventionally used in the developing solution of this type. Exemplary of such a basic organic compound are aliphatic and aromatic amine compounds such as alkylene diamines, e.g. 1,3-diaminopropane, and aryl amines, e.g. 4,4'-diaminodiphenyl amine, as well as bis(dialkylamino) imines, heterocyclic bases having a ring structure formed of 3 to 5 carbon atoms and 1 or 2 hetero atoms selected from nitrogen, oxygen and sulfur atoms as the ring members, e.g. pyrrole, pyrrolidine, pyrrolidone, pyridine, morpholine, pyrazine, piperidine, oxazole and thiazole, lower alkyl quaternary ammonium bases and others. Particularly preferable among them are tetramethyl ammonium hydroxide and trimethyl 2-hydroxyethyl ammonium hydroxide, i.e. choline. The above named organic bases free from metal ions can be used either singly or as a combination of two kinds or more according to need.

The inventive developing solution is prepared in the range from 11.0 to 13.5 pH by dissolving the above mentioned basic organic compound in water.

The optional additives used in conventional developing solutions, which may be contained also in the inventive developing solution, include, in addition to wetting agents, stabilizers and dissolving aids, surface active agents of other types and non-surface active quaternary ammonium compounds, which serve to improve the dissolving selectivity between the exposed and unexposed areas of the positive-working photoresist layer, and monohydric alcohols, which serve to remove scum and foul thin film of the photoresist which may otherwise be left on the exposed areas after development. These optional additives can be added to the inventive developing solution either singly or as a combination of two kinds or more according to need.

The first class of the fluorine-containing surface active agent as the essential ingredient in the inventive developing solution includes anionic ones represented by the general formula $$R_fCOOM, \quad (I)$$

or $$R'_fSO_3M, \quad (II)$$

in which $R_f$ and $R'_f$ each denote a monovalent hydrocarbon group having from 2 to 20 carbon atoms, of which at least a part of the hydrogen atoms are replaced with fluorine atoms, and M denotes a hydrogen atom H, ammonium $NH_4$ or quaternary ammonium $NR_4$, each R being, independently from the others, a hydrogen atom or a alkyl group having from 1 to 3 carbon atoms. More particularly, the fluorine-containing carboxylic and sulfonic acids and salts of the above mentioned types having an activity as a surface active agent include straight-chain or branched-chain perfluorocarboxylic acids of the formula $C_nF_{2n+1}COOH$, perfluoroalkane sulfonic acids of the formula $C_nF_{2n+1}SO_3H$, partially fluorinated carboxylic acids of the formula $C_nF_{2n+1}C_mH_{2m}COOH$, partially fluorinated unsaturated carboxylic acids of the formula $C_nF_{2n+1}CH=CHC_mH_{2m}COOH$, partially fluorinated alkane sulfonic acids of the formula $C_nF_{2n+1}C_mH_{2m}SO_3H$ and partially fluorinated alkene sulfonic acids of the formula $C_nF_{2n+1}CH=CHC_mH_{2m}SO_3H$, in which n and m are each a positive integer of 1 to 10 and 1 to 15, respectively, as well as ammonium salts and tetraalkyl ammonium salts thereof.

Particular compounds belonging to these classes include perfluorocaprylic acid $C_7F_{15}COOH$, perfluorooctane sulfonic acid $C_8F_{17}SO_3H$, ammonium perfluorocaprate $C_9F_{19}COONH_4$, tetramethyl ammonium perfluorocaprylate $C_7F_{15}COON(CH_3)_4$, $C_5F_{11}(CH_2)_3COOH$, 
$CF_3(CF_2)_3CF(CF_3)(CH_2)_{10}COONH_4$, $CF_3(CF_2)_6CH=CH(CH_2)_2COOHN_4$ and the like though not limited thereto. These compounds can be used either singly or a combination of two kinds or more according to need.

The second class of the fluorine-containing surface active agent as the essential ingredient in the inventive developing solution includes non-ionic ones represented by the general formula $$R''_f-A-(CH_2CH_2O)_p R', \qquad (III)$$

in which R' is H, R''$_f$ is a perfluoroalkyl group having 3 to 15 carbon atoms, A is a divalent group selected from the class consisting of $-(CH_2)_pSO_2NR^1-$, $-(CH_2)_qO-$,  $-(CH_2)_q CO-NR^1$, $-SO_2-$, $-CO-O-$ and $-SO_2-NR^1-CH_2-CO-O-$, p is zero or a positive integer not exceeding 20, q is zero or a positive integer not exceeding 5 and $R^1$ is a hydrogen atom, an alkyl group having 1 to 6 carbon atoms or a group of the formula $-(CH_2CH_2O)_r R^2 R^2$ being an alkyl group having 1 to 6 carbon atoms and r being a positive integer not exceeding 20.

Particular compounds in conformity with the formula (III) and the definitions of the symbols include those compounds expressed by the following structural formulas: $CF_3(CF_2)_7O(CH_2CH_2O)_{10}H$, $CF_3(CF_2)_7SO_2N(C_2H_5)(CH_2CH_2O)_{14}H$, $CF_3(CF_2)_7SO_2N(C_2H_5)CH_2COO(CH_2CH_2O)_{10}H$, $CF_3(CF_2)_7.(CF_2)_3.CON(CH_3)(CH_2CH_2O)_{10}H$ and the like though not limited thereto. These compounds can be used either singly or as a combination of two kinds or more according to need.

The inventive developing solution for positive-working photoresist compositions based on a basic organic compound free from metal ions should contain the above described anionic or non-ionic fluorine-containing surface active agent in an amount in the range from 50 to 5000 ppm by weight or, preferably, from 100 to 1000 ppm by weight. When the amount thereof is too small, the desired effect of wettability improvement of the solution cannot be fully obtained. When the amount thereof is too large, on the other hand, the patterned photoresist layer obtained by the development with the developing solution may be somewhat inferior in respect of the sharpness of the pattern.

When the developing solution for positive-working photoresist compositions containing an organic base as the principal ingredient is admixed with the above described anionic or non-ionic fluorine-containing surface active agent in the specified amount, the developing solution is imparted with improved wettability on the photoresist layer so that the developing solution can spread at an increased velocity over whole surface of the wafer contributing to the improvement of the uniformity of development. Namely, conventional developing solutions without admixture of the fluorine-containing surface active agent may sometimes cause troubles in development due to bubbles adhering to the surface of the photoresist layer development with such a developing solution may take an undesirably long time while such disadvantages can be overcome by the addition of the fluorine-containing surface active agent to the solution which can rapidly spread over whole surface of the wafer with the bubbles lifted to float on the surface of the developing solution.

Further, addition of the above described fluorine-containing surface active agent to the developing solution for positive-working photoresist compositions has another advantage that the temperature dependency of the developing solution is remarkably decreased so that the latitude of the conditions in the process of development is enlarged. As is known, the developing solution containing a tetraalkyl ammonium hydroxide as the principal ingredient has the highest dissolving power in the temperature range from 20° to 25° C. decreasing at higher or lower temperatures in the development of a photoresist layer of a positive-working composition comprising a novolac resin as the film-forming component and a polyhydroxybenzophenone ester of naphthoquinone diazide-5-sulfonic acid as the photosensitive component in combination. When the developing solution is admixed with a fluorine-containing surface active agent according to the invention, the temperature dependency of the developing solution is greatly decreased so that the process of development can be performed with larger latitude of the conditions relative to the temperature.

It is known that the developing solution containing choline, potassium hydroxide, sodium hydroxide, sodium silicate and the like as the principal ingredient has an increased sensitivity when temperature is increased exhibiting higher dissolving power in the unexposed areas of the photoresist layer. The sensitivity of a developing solution is also increased by the increase of temperature resulting in an increase in the film thickness reduction in the unexposed areas of a positive-working photoresist layer when the photosensitive constituent of the photoresist composition is a naphthoquinone diazide sulfonic acid ester of a polyhydroxy compound such as an alkyl gallate, novolac resin, polyhydroxy benzene and the like. The temperature dependency of the developing solution used in these cases can be decreased by the admixture of a fluorine-containing surface active agent according to the present invention to enlarge the latitude of the conditions in the process of development.

Addition of an anionic or non-ionic fluorine-containing surface active agent to a developing solution, of which the principal ingredient is an organic base free from metal ions, according to the present invention has an effect to increase the wettability and spreadability of the developing solution on the surface of the positive-working photoresist layer and the effect is not lost even by changes in the temperature of development.

In the following, the developing solution of the invention is illustrated in more detail by way of examples and comparative examples.

EXAMPLES 1 TO 12 AND COMPARATIVE EXAMPLES 1 TO 5

Base developing solutions for positive-working photoresist compositions were prepared by dissolving tetramethyl ammonium hydroxide or choline in water in a concentration of 2.38% or 4.2% by weight, respectively, and these developing solutions have pH value of 13, respectively, each of the base developing solutions was admixed with an anionic fluorine-containing surface active agent indicated in Table 1 below in an indicated concentration to give a developing solution according to the present invention.

Each of the thus prepared inventive developing solutions and the base developing solutions without addition of the fluorine-containing surface active agent was subjected to the test of the performance in development in the following manner. Thus, a semiconductor silicon wafer of 4 inch diameter was coated with a positive-working photoresist composition (OFPR-5000, a product by Tokyo Ohka Kogyo Co.) in a thickness of 1.3 μm as dried using a spinner (Resist Coater TR-4000, manufactured by Tatsumo Co.) followed by pre-baking on a hot plate at 110° C. for 90 seconds. The silicon wafer provided with the photoresist layer was exposed to light patternwise through a test chart (manufactured by Dai-Nippo Printing Co.) on an exposure machine for minifying projection (Model DSW 4800, manufactured by GCA Co.) and then subjected to stationary development at 23° C. in an apparatus for stationary development (manufactured by Tokyo Ohka Kogyo Co.) using one of the above prepared developing solutions followed by rinse with pure water for 30 seconds and drying by blowing of nitrogen gas. The quality of the thus obtained patternwise photoresist layer on each silicon wafer was microscopically examined to give the results shown in Table 1 by rating in A, B and C according to the following criteria.

A: The condition of developed pattern was quite satisfactory with uniform line width over the whole surface.
B: The condition of developed pattern was acceptable although no good uniformity was obtained in the line width over the whole surface.
C: The condition of developed pattern was unacceptable.

In Table 1, the types of the base developing solutions are indicated with the symbols T and C for the solutions containing 2.38% by weight of tetramethyl ammonium hydroxide and 4.2% by weight of choline, respectively.

As is clear from the results shown in Table 1, all of the developing solutions admixed with an anionic fluorine-containing surface active agent gave quite satisfactory results with an exception of only one example even when the development time was 20 seconds. In Comparative Examples, on the contrary, satisfactory results of development could be obtained with the developing solution containing no fluorine-containing surface active agent only when the development time was extended to 60 seconds.

EXAMPLE 13

Developing solutions according to the invention were prepared by admixing a base developing solution for positive-working photoresist compositions, which was an aqueous solution of tetramethyl ammonium hydroxide as a metal ion-free organic base in a concentration of 2.38% by weight, this developing solution has pH value of 13, with 100 ppm, 500 ppm or 1000 ppm of ammonium perfluorooctoate $C_7F_{15}COONH_4$ as an anionic fluorine-containing surface active agent.

TABLE 1

| | Type of base solution | Flourine-containing surface active agent | | Development time, seconds | Quality of patterned layer |
|---|---|---|---|---|---|
| | | Structural formula | Concentration, ppm | | |
| Comparative Example | | | | | |
| 1 | T | None | — | 20 | C |
| 2 | T | None | — | 30 | C |
| 3 | T | None | — | 40 | B |
| 4 | T | None | — | 60 | A |
| 5 | C | None | — | 30 | C |
| Example | | | | | |
| 1 | T | $C_7F_{15}COONH_4$ | 50 | 20 | Partly B |
| 2 | T | $C_7F_{15}COONH_4$ | 100 | 20 | A |
| 3 | T | $C_7F_{15}COONH_4$ | 1000 | 20 | A |
| 4 | T | $C_5F_{11}(CH_2)_3COOH$ | 300 | 20 | A |
| 5 | T | $C_7F_{15}COOH$ | 2000 | 20 | A |
| 6 | T | $C_9F_{19}COOH$ | 200 | 20 | A |
| 7 | T | $C_8F_{17}SO_3H$ | 500 | 20 | A |
| 8 | T | $CF_3(CF_2)_3CF(CF_3)(CH_2)_{10}COONH_4$ | 200 | 20 | A |
| 9 | T | $CF_3(CF_2)_6CH=CH(CH_2)_7COONH_4$ | 200 | 20 | A |
| 10 | C | $C_7F_{15}COONH_4$ | 100 | 20 | A |
| 11 | C | $C_7F_{15}COOH$ | 200 | 20 | A |
| 12 | C | $C_7F_{15}COON(CH_3)_4$ | 200 | 20 | A | with 100 ppm, 500 ppm or 1000 ppm of ammonium perfluorooctoate $C_7F_{15}COONH_4$ as an anionic fluorine-containing surface active agent.

Each of the thus prepared developing solutions including the base solution was used for the development of the photoresist layers formed on several silicon wafers and exposed to light patternwise in the same manner as in the preceding examples. The temperature of the developing solution was varied in the range from 15 to 40° C. with 5° C. intervals to determine the sensitivity which was the minimum exposure time in milliseconds required for obtaining a reproduction of the patternwise image with high fidelity. The results are shown in FIG. 1 of the accompanying drawing from which it is understood that the sensitivity of the developing solution has an apparently decreased temperature dependency by the addition of the anionic fluorine-containing surface active agent according to the invention.

EXAMPLES 14 TO 20

Base developing solutions were prepared by dissolving tetramethyl ammonium hydroxide or choline in water in a concentration of 2.38% or 4.2%, respectively, these developing solutions have pH value of 13, respectively, and developing solutions for positive-working photoresist compositions according to the invention were prepared each by admixing the base developing solution with a non-ionic fluorine containing surface active agent indicated in Table 2 in a concentration indicated in the table. These developing solutions according to the invention were subjected to the test of the performance in development in the same manner as in Example 1 to give the results shown in Table 2.

As is understood from the results shown in Table 2, the developing solutions of the invention gave satisfactory results in development of the photoresist layer even when the development time was as short as 30 seconds while the base developing solutions without admixture of the non-ionic fluorine-containing surface active agent could give satisfactory results only when the development time was extended to 60 seconds.

EXAMPLE 21

A base developing solution, which was an aqueous solution of tetrmmethyl ammonium hydroxide in a concentration of 2.38% by weight, this developing solution has pH value of 13, was admixed with one of the three non-ionic fluorine-containing surface active agents of the formulas:

$CF_3(CF_2)_7O(CH_2CH_2O)_{10}H$;

$CF_3(CF_2)_7(CH_2)_3CON(CH_2)_2(CH_2CH_2O)_{10}H$; and

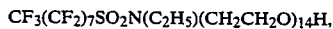

$CF_3(CF_2)_7SO_2N(C_2H_5)(CH_2CH_2O)_{14}H$, each in a concentration of 500 ppm by weight to give developing solutions for positive-working photoresist compositions according to the present invention.

Figure 2:
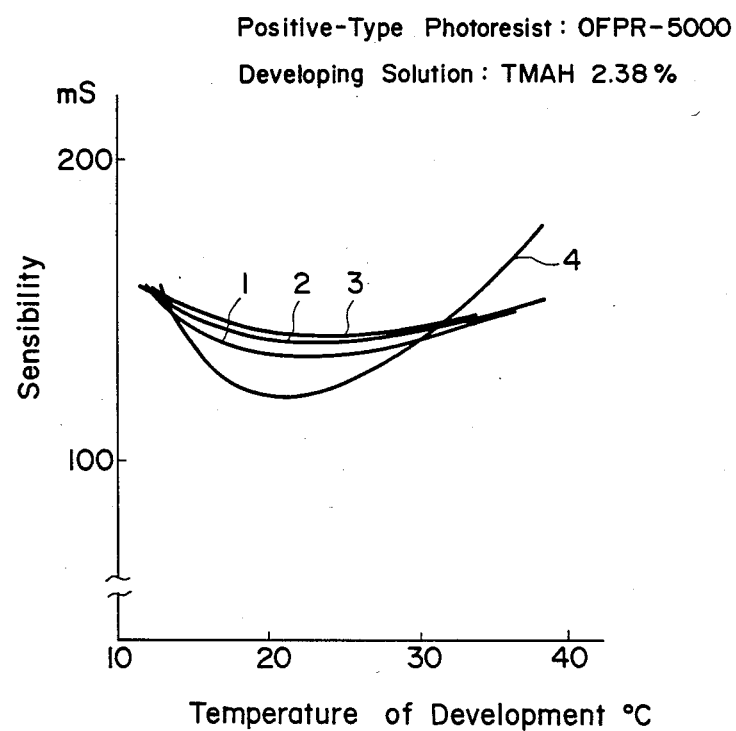
FIG. 2 is a graph showing the sensitivity of developing solutions without or with admixture of 500 ppm of a fluorine-containing non-ionic surface active agent as a function of the temperature of development.

These developing solutions were each subjected to the determination of the sensitivity, i.e. the minimum exposure time in milliseconds required for the reproduction of the pattern of the test chart with high fidelity, at temperatures in the range from 15° to 40° C. with 5° C. intervals in the same manner as in Example 14 to give the results shown in FIG. 2, in which the curves 1, 2, 3 and 4 are for the developing solutions admixed with the above named first, second and third fluorine-containing surface active agents and the base developing solution without addition of the surface active agent, respectively. As is clear from these results, the temperature dependency of the sensitivity of development solutions could be markedly decreased by the addition of the non-ionic fluorine-containing surface active agents.

What is claimed is:

1. A developing solution for positive-working photoresist compositions which comprises:
   (a) an aqueous medium;
   (b) an organic basic compound free from metal ions in an an amount sufficient to obtain a pH between 11.0 and 13.5; and
   (c) a fluorine-containing surface active agent in a concentration in the range from of 50 to 5000 ppm by weight, based on the amount of the developing solution, said fluorine-containing surface active agent being selected from the group consisting of an ionic fluorine-containing compounds represented by the general formula $R_fCOOM$ and $R'_fSO_3M$, wherein $R_f$ and $R'_f$ are each a monovalent hydrocarbon group having from 2 to 20 carbon atoms, of which at least a part of the hydrogen atoms are replaced with fluorine atoms, and M is an atom or group selected from the group consisting of hydrogen, ammonium, quaternary ammonium of the formula $NR_4$, wherein each R is independently hydrogen or an alkyl group having 1 to 3 carbon atoms.

2. The developing solution for positive-working photoresist compositions as claimed in claim 1 wherein the organic basic compound free from metal ions is tetramethyl ammonium hydroxide or choline.

* * * * *

TABLE 2

| Example No. | Type of base Solution | Flourine-containing surface active agent | | Quality of patterned layer |
|---|---|---|---|---|---|
| | | Structural formula | Concentration ppm | Development time, seconds | |
| 14 | T | $CF_3(CF_2)_7O(CH_2CH_2O)_{10}H$ | 50 | 30 | B |
| 15 | T | $CF_3(CF_2)_7O(CH_2CH_2O)_{10}H$ | 500 | 30 | A |
| 16 | T | $CF_3(CF_2)_7SO_2N(C_2H_5)(CH_2CH_2O)_{14}H$ | 500 | 30 | A |
| 17 | T | $CF_3(CF_2)_7SO_2N(C_2H_5)CH_2COO(CH_2CH_2O)_{10}H$ | 500 | 30 | A |
| 18 | T | $CF_3(CF_2)_7(CH_2)_3CON(CH_3)(CH_2CH_2O)_{10}H$ | 500 | 30 | A |
| 19 | C | $CF_3(CF_2)_7(CH_2CH_2O)_{10}H$ | 500 | 30 | A |
| 20 | C | $CF_3(CF_2)_7SO_2N(C_2H_5)(CH_2CH_2O)_{14}H$ | 500 | 30 | A |